(12) United States Patent
Stoltenberg et al.

(10) Patent No.: US 10,470,314 B1
(45) Date of Patent: Nov. 5, 2019

(54) METHODS OF SOLDERING AND APPLICATIONS THEREOF

(71) Applicant: LOCKHEED MARTIN CORPORATION, Bethesda, MD (US)

(72) Inventors: Randall Mark Stoltenberg, Palo Alto, CA (US); Nathan Khosla, La Jolla, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 16/056,119

(22) Filed: Aug. 6, 2018

(51) Int. Cl.
| H05K 1/11 | (2006.01) |
| H05K 3/34 | (2006.01) |
| B23K 1/19 | (2006.01) |
| H05K 3/12 | (2006.01) |
| B23K 1/00 | (2006.01) |

(52) U.S. Cl.
CPC ......... *H05K 3/3463* (2013.01); *B23K 1/0016* (2013.01); *B23K 1/19* (2013.01); *H05K 3/125* (2013.01); *H05K 3/3452* (2013.01); *H05K 3/3478* (2013.01)

(58) Field of Classification Search
CPC .......... B23K 1/19; B23K 1/0016; H05K 1/11; H05K 3/3463; H05K 3/125; H05K 3/3452; H05K 3/3478; H01L 23/04; H01L 23/3735; H01L 23/49811; H01L 24/29; H01L 24/32; H01L 24/83; H01L 25/072

USPC ........................................................ 174/263
See application file for complete search history.

(56) References Cited

U.S. PATENT DOCUMENTS

| 2005/0184369 A1* | 8/2005 | Sonoda ............... B23K 35/262 257/677 |
| 2011/0233793 A1* | 9/2011 | Miura .................. B23K 1/0016 257/779 |
| 2013/0049204 A1* | 2/2013 | Oeschler ................ H01L 24/29 257/772 |
| 2015/0035137 A1* | 2/2015 | Nishimoto ......... B23K 35/3006 257/712 |

* cited by examiner

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

The present disclosure describes methods of soldering on printed circuits, and, more specifically, to methods of using a copper-containing layer or copper "ink" in low-temperature soldering using established solder processes on silver-containing layers in circuit boards. The present disclosure is also directed, in part, to a solder joint having a copper-containing layer acting as a bonding layer between a traditional solder and a silver-containing layer "ink" on a printed circuit board. The low-temperature forming of the solder joint occurs at or below a temperature of 300° C. and occurs via at least one of sintering, photosintering, lasersintering, local resistive heating, or electrochemical deposition. The methods disclosed can satisfy the growing demand for creating reliable interconnection joints that can be used in next generation electronics and printed electrical circuit boards.

15 Claims, 4 Drawing Sheets

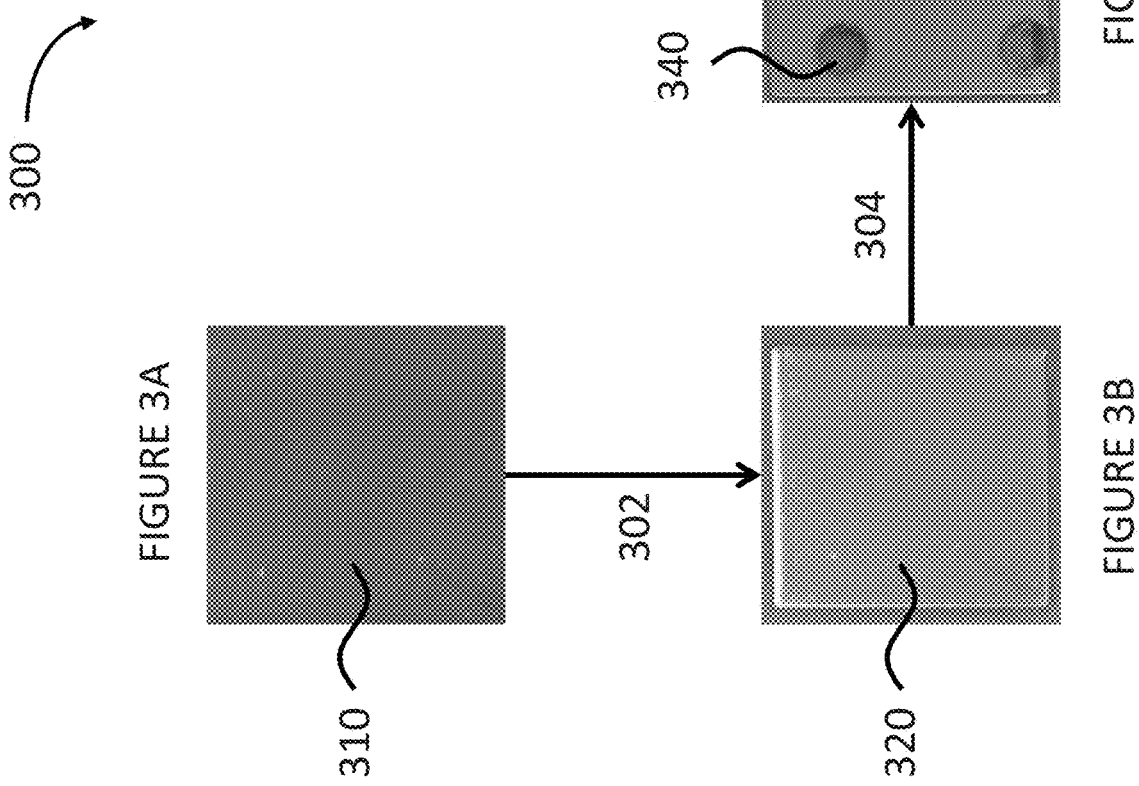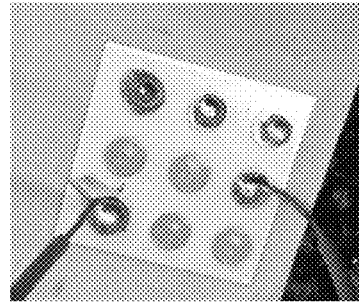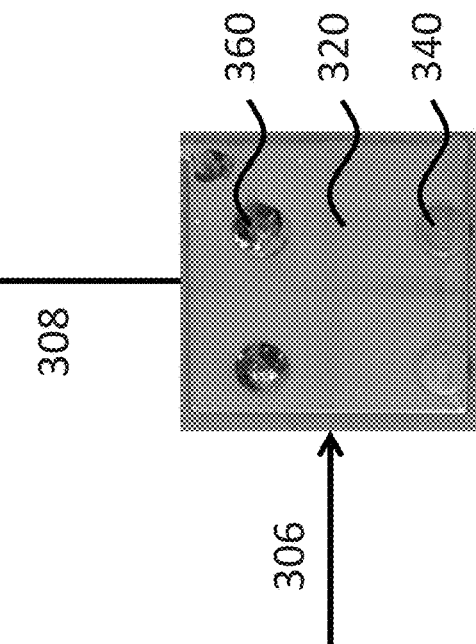

METHODS OF SOLDERING AND APPLICATIONS THEREOF

CROSS-REFERENCES TO RELATED APPLICATIONS

Not applicable.

STATEMENT REGARDING FEDERALLY SPONSORED RESEARCH OR DEVELOPMENT

Not applicable.

FIELD

The present disclosure generally relates to methods of soldering on printed circuits, and, more specifically, to methods of using copper ink in low-temperature soldering using established solder processes on silver-containing layers in electronic circuits.

BACKGROUND

The growing demand for highly reliable and compact electronic modules requires optimized interconnection and packaging technologies. Emerging materials and cost effective manufacturing concepts, such as using thin film interconnections through a printing technique can offer a high degree of customization and design flexibility. In particular, thin silver structures or thin silver-containing layers have been widely demonstrated as next generation thin film interconnection joints that can be used in next generation electronics and printed electrical circuit boards, including flexible and stretchable substrates.

However, soldering to thin silver structures, such as those produced when using printed silver-containing layers (also referred to as "silver inks") remains a challenge. For example, standard solders do not wet particularly well to the surface of a printed silver-containing layer, leaving beads of solder on the printed plane rather than forming an ideal solder interconnection joint to the silver-containing layer. This often leads to reduced surface contact areas at the interconnection joint which hinders both the electrical conductance and the mechanical viability of the joint. Further, there is a tendency for the solder to dissolve the printed silver-containing layer, leaving a void instead of making an interconnection joint, thereby causing issues with the silver-substrate adhesion that often leads to delamination.

Currently, soldering to silver has been achieved by high temperature brazing at temperatures ranging from 618° C. to 899° C. where a high silver content filler is used as an intermediate layer that is to be melted in between adjoining surfaces. Another method involves using a specialty, low melting point, high silver content solder in creating the interconnection joint. Regardless, these silver-based interconnection approaches still show poor mechanical strength compared to traditional non-silver solder joints. Therefore, a new approach is needed to satisfy the growing demand for creating reliable interconnection joints that can be used in next generation electronics and printed electrical circuit boards.

In view of the foregoing, improved solderability to silver-containing layers and methods for creating reliable interconnection joints that can be used in next generation electronics and printed electrical circuit boards would be of considerable interest in the art. The present disclosure satisfies the foregoing need and provides related advantages as well.

SUMMARY

In various embodiments, the present disclosure describes methods for forming a solder joint on a printed circuit board and, more specifically, methods of using a copper-containing layer (also referred to as "copper ink") in low-temperature (or room-temperature) soldering using established solder processes on silver-containing layers on circuit boards, including flexible and stretchable substrates. The present disclosure is also directed, in part, to a solder joint having a copper-containing layer acting as a bonding layer between a traditional solder and a silver-containing layer "ink" on printed circuit boards. In some embodiments, the method includes depositing a silver-containing layer on a portion of a substrate, depositing a copper-containing layer on at least a portion of the silver-containing layer, depositing an electronic assembly material on at least a portion of the copper-containing layer, and forming a solder joint. In the method, the forming of the solder joint occurs at or below a temperature of 300° C. In some embodiments, the depositing the copper-containing layer occurs via at least one of: a printing technique, or electrochemical deposition. After the depositing the copper-containing layer occurs via the printing technique, the method further includes sintering the copper-containing layer at or below a temperature of 300° C. via at least one of: thermalsintering, photosintering, lasersintering, or local resistive heating. In other embodiments of the method, the solder joint comprises a solder-copper interface and a copper-silver interface. In some embodiments, the substrate is at least one of: a printed circuit board, a flexible substrate, a foldable substrate, a stretchable substrate, a semi-rigid circuit board, or a rigid circuit board.

In other embodiments, the present disclosure describes an article comprising a solder joint deposited on a portion of a substrate, wherein the solder joint comprises a silver-containing layer, a copper-containing layer, and an electronic assembly material. In the article, the copper-containing layer is formed at or below a temperature of 300° C. In some embodiments, the copper-containing layer is formed via at least one of: sintering, thermalsintering, photosintering, lasersintering, local resistive heating, or electrochemical deposition. In the article, the solder joint further includes at least one of: a solder-copper interface between the electronic assembly material and the copper-containing layer, or a copper-silver interface between the copper-containing layer and the silver-containing layer. In some embodiments, the substrate is at least one of: a printed circuit board, a flexible substrate, a foldable substrate, a stretchable substrate, a semi-rigid circuit board, or a rigid circuit board. In some embodiments, the copper-containing layer in the article has a thickness of about 1 nm to about 100 μm.

The foregoing has outlined rather broadly the features of the present disclosure in order that the detailed description that follows can be better understood. Additional features and advantages of the disclosure will be described hereinafter. These and other advantages and features will become more apparent from the following description.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosures. These embodiments are for illustrative purposes only and are not to scale, instead emphasizing the principles of the disclosure. These drawings include the following figures, in which like numerals indicate like parts:

FIGS. 3A-3E show optical images of the solder joint after each process step of the method shown in FIG. 2.

DETAILED DESCRIPTION

Figure 1:
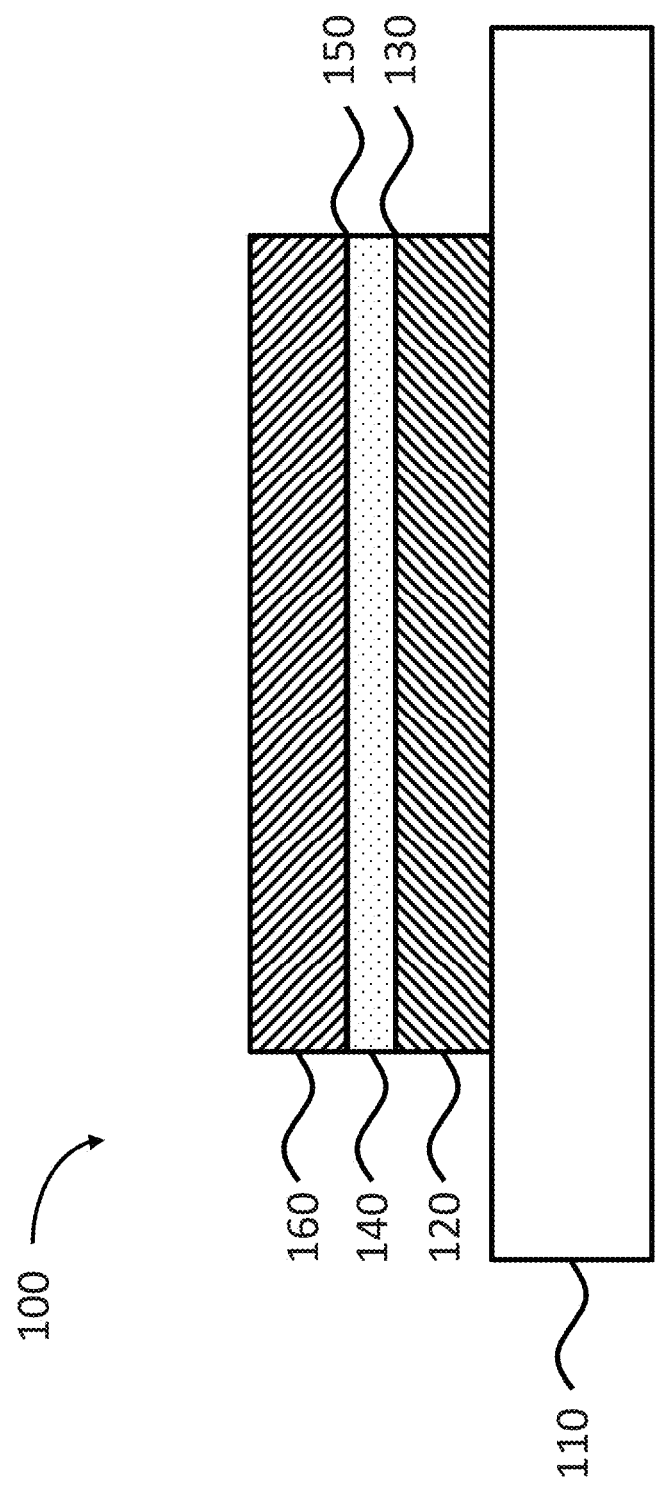
FIG. 1 is a schematic illustration of a solder joint having a copper-containing layer, according to some embodiments.

The present disclosure is directed, in part, to methods of soldering on printed circuit, and, more specifically, to methods of using a copper-containing layer (also referred to as "copper ink") in low-temperature soldering using established solder processes on silver-containing layers on circuit boards. The present disclosure is also directed, in part, to a solder joint having a copper-containing layer acting as a bonding layer between a traditional solder and a silver-containing layer "ink" on printed circuit boards.

As discussed above, soldering to thin silver-containing layers (also referred to as "silver inks") is a growing problem as printed and flexible electronics gain traction. Silver inks are currently the most mature product for printed conductors, so their use is almost ubiquitous in the printed electronics community. However, the thin silver-containing layers produced via printed inks are notoriously difficult to solder because silver is readily dissolved during the soldering process. For example, it only takes a few seconds for a hot liquid solder to dissolve a few tens of micrometers (μm) of silver. Hence, many printed electronic applications rely on either boutique solders (e.g., bismuth (Bi) or indium (In) based) with lower liquidus temperatures and high silver content to mitigate silver pad dissolution, which typically yields lower strength bonds, or silver epoxies to glue wires and contact pads together, which result in poor electrical connections.

Another issue encountered in soldering components with thin silver-containing layers is the leaching of silver into solder joints. When using a conductive epoxy, the contact resistance of the solder joint is too high. When a silver filled solder SN62 and SN43 with Bi is used, it requires a high temperature and often leads to silver dissolving into the solder. If a lower temperature is used, however, the solder joint does not have a proper wetting and usually results in solder balls. Lead-free solders, such as tin-silver-copper (Sn—Ag—Cu or SAC), including customized SAC with custom silver and copper content to change liquidus or solidus points as well as wetting to different finishes of the custom SAC, and tin-bismuth-silver (SnBiAg), offer soldering solutions, although with caveats at operating temperature above 200° C. and poor wetting, respectively. Likewise, silver epoxies can be used for silver soldering, however with low thermal and electrical conductivity (i.e., high resistance) at the solder joint.

The present disclosure describes methods for creating reliable interconnection joints using silver-containing layers that can be used in next generation electronics and printed electrical circuit boards. The methods of forming a solder joint include using a barrier layer of copper on top of a silver-containing layer. The methods provide two benefits, namely, the use of traditional solder with no silver dissolution issues, and confinement of solder to printed copper area for precise solder control. The methods describe herein can be extended to any printed metal that has superior solderability over silver and provides a protective barrier against dissolution.

FIG. 1 shows a schematic illustration of a solder joint 100 deposited on a substrate 110. According to some embodiments, the solder joint 100 is deposited on a portion of the substrate 110. The solder joint 100 includes a silver-containing layer 120 deposited on at least a portion of the substrate 110. The solder joint 100 further includes a copper-containing layer 140 deposited on at least a portion of the silver-containing layer 120. In some embodiments, the solder joint 100 includes the copper-containing layer 140 deposited on an entire surface of the silver-containing layer 120. The solder joint 100 further includes an electronic assembly material 160 deposited on at least a portion of the copper-containing layer 140. In some embodiments, the solder joint 100 includes the electronic assembly material 160 deposited on an entire surface of the copper-containing layer 140. In some embodiments, the solder joint 100 further includes a copper-silver interface 130 between the copper-containing layer 140 and the silver-containing layer 120. In other embodiments, the solder joint 100 further includes a solder-copper interface 150 between the electronic assembly material 160 and the copper-containing layer 140.

In some embodiments, the substrate 110 can be a printed circuit board, a flexible substrate, a foldable substrate, a stretchable substrate, a semi-rigid circuit board, or a rigid circuit board. In some embodiments, the substrate 110 can be a printed circuit board, such as glass fiber epoxy resin. In some embodiments, the substrate 110 can be a flexible substrate, such as polyimide (Kapton), polyethylene terephthalate (PET), acrylonitrile butadiene styrene (ABS), or other plastic films used for printed circuits. In some embodiments, the substrate 110 can be glass, glass-filled teflon (PTFE), or other composite fiber substrates, polyvinylidene fluoride (PVDF), etc.

In some embodiments, the silver-containing layer 120 can be elemental silver metal. In other embodiments, the silver-containing layer 120 can include a silver alloy or a silver composite. In some embodiments, the silver alloy or silver composite can include one or more materials, including but not limited to, metal, non-metal, and polymer. In some embodiments, the silver-containing layer 120 can be polycrystalline silver. In other embodiments, the silver-containing layer 120 can be nanocrystalline or microcrystalline silver.

In some embodiments, the silver-containing layer 120 can have a thickness range from about 1 nm to about 100 μm. In some embodiments, the silver-containing layer 120 has a thickness range from about 1 nm to about 1 μm, from about 1 nm to about 10 μm, from about 1 nm to about 100 μm, from about 10 nm to about 1 μm, from about 10 nm to about 10 μm, from about 10 nm to about 100 μm, from about 50 nm to about 1 μm, from about 50 nm to about 10 μm, from about 50 nm to about 100 μm, from about 100 nm to about 1 μm, from about 100 nm to about 10 μm, from about 100 nm to about 100 μm, from about 200 nm to about 1 μm, from about 200 nm to about 10 μm, from about 200 nm to about 100 μm, from about 500 nm to about 1 μm, from about 500 nm to about 10 μm, from about 500 nm to about 100 μm, from about 1 μm nm to about 10 μm, from about 1 μm to about 100 μm, and from about 10 μm to about 100 μm, inclusive of any thickness ranges therebetween.

In some embodiments, the silver-containing layer 120 has a thickness of about 1 nm or greater, about 10 nm or greater, about 50 nm or greater, about 60 nm or greater, about 70 nm or greater, about 80 nm or greater, about 90 nm or greater, about 100 nm or greater, about 120 nm or greater, about 140 nm or greater, about 160 nm or greater, about 180 nm or greater, about 200 nm or greater, about 250 nm or greater, about 300 nm or greater, about 350 nm or greater, about 400 nm or greater, about 450 nm or greater, about 500 nm or greater, about 550 nm or greater, about 600 nm or greater, about 650 nm or greater, about 700 nm or greater, about 750 nm or greater, about 800 nm or greater, about 850 nm or greater, about 900 nm or greater, about 950 nm or greater, about 1 μm or greater, about 1.1 μm or greater, about 1.2 μm or greater, about 1.3 μm or greater, about 1.4 μm or greater, about 1.5 μm or greater, about 1.6 μm or greater, about 1.7 μm or greater, about 1.8 μm or greater, about 1.9 μm or greater, about 2 μm or greater, about 3 μm or greater, about 4 μm or greater, about 5 μm or greater, about 6 μm or greater, about 7 μm or greater, about 8 μm or greater, about 9 μm or greater, about 10 μm or greater, about 12 μm or greater, about 14 μm or greater, about 16 μm or greater, about 18 μm or greater, about 20 μm or greater, about 25 μm or greater, about 30 μm or greater, about 35 μm or greater, about 40 μm or greater, about 45 μm or greater, about 50 μm or greater, about 55 μm or greater, about 60 μm or greater, about 65 μm or greater, about 70 μm or greater, about 75 μm or greater, about 80 μm or greater, about 85 μm or greater, about 90 μm or greater, about 95 μm or greater, and about 100 μm, inclusive of any thicknesses therebetween.

In some embodiments, the silver-containing layer 120 can have an average lateral dimension range from about 10 nm to about 10 mm. In some embodiments, the silver-containing layer 120 has an average lateral dimension range from about 10 nm to about 10 mm, about 100 nm to about 10 mm, about 1 μm to about 10 mm, about 10 μm to about 10 mm, about 100 μm to about 10 mm, about 1 mm to about 10 mm, about 10 nm to about 1 mm, about 100 nm to about 1 mm, about 1 μm to about 1 mm, about 10 μm to about 1 mm, about 100 μm to about 1 mm, about 1 mm to about 1 mm, about 10 nm to about 100 μm, about 100 nm to 100 μm, about 1 μm to about 100 μm, about 10 μm to about 100 μm, inclusive of any average lateral dimension ranges therebetween.

In some embodiments, the copper-containing layer 140 can be elemental copper metal. In other embodiments, the copper-containing layer 140 can include a copper alloy or a copper composite. In some embodiments, the copper alloy or copper composite can include one or more materials, including but not limited to, metal, non-metal, and polymer. In some embodiments, the copper-containing layer 140 can be polycrystalline copper. In other embodiments, the copper-containing layer 140 can be nanocrystalline or microcrystalline copper.

In some embodiments, the copper-containing layer 140 can have a thickness range from about 1 nm to about 100 μm. In some embodiments, the copper-containing layer 140 has a thickness range from about 1 nm to about 1 μm, from about 1 nm to about 10 μm, from about 1 nm to about 100 μm, from about 10 nm to about 1 μm, from about 10 nm to about 10 μm, from about 10 nm to about 100 μm, from about 50 nm to about 1 μm, from about 50 nm to about 10 μm, from about 50 nm to about 100 μm, from about 100 nm to about 1 μm, from about 100 nm to about 10 μm, from about 100 nm to about 100 μm, from about 200 nm to about 1 μm, from about 200 nm to about 10 μm, from about 200 nm to about 100 μm, from about 500 nm to about 1 μm, from about 500 nm to about 10 μm, from about 500 nm to about 100 μm, from about 1 μm nm to about 10 μm, from about 1 μm to about 100 μm, and from about 10 μm to about 100 μm, inclusive of any thickness ranges therebetween.

In some embodiments, the copper-containing layer 140 has a thickness of about 1 nm or greater, about 10 nm or greater, about 50 nm or greater, about 60 nm or greater, about 70 nm or greater, about 80 nm or greater, about 90 nm or greater, about 100 nm or greater, about 120 nm or greater, about 140 nm or greater, about 160 nm or greater, about 180 nm or greater, about 200 nm or greater, about 250 nm or greater, about 300 nm or greater, about 350 nm or greater, about 400 nm or greater, about 450 nm or greater, about 500 nm or greater, about 550 nm or greater, about 600 nm or greater, about 650 nm or greater, about 700 nm or greater, about 750 nm or greater, about 800 nm or greater, about 850 nm or greater, about 900 nm or greater, about 950 nm or greater, about 1 μm or greater, about 1.1 μm or greater, about 1.2 μm or greater, about 1.3 μm or greater, about 1.4 μm or greater, about 1.5 μm or greater, about 1.6 μm or greater, about 1.7 μm or greater, about 1.8 μm or greater, about 1.9 μm or greater, about 2 μm or greater, about 3 μm or greater, about 4 μm or greater, about 5 μm or greater, about 6 μm or greater, about 7 μm or greater, about 8 μm or greater, about 9 μm or greater, about 10 μm or greater, about 12 μm or greater, about 14 μm or greater, about 16 μm or greater, about 18 μm or greater, about 20 μm or greater, about 25 μm or greater, about 30 μm or greater, about 35 μm or greater, about 40 μm or greater, about 45 μm or greater, about 50 μm or greater, about 55 μm or greater, about 60 μm or greater, about 65 μm or greater, about 70 μm or greater, about 75 μm or greater, about 80 μm or greater, about 85 μm or greater, about 90 μm or greater, about 95 μm or greater, and about 100 μm, inclusive of any thicknesses therebetween.

In some embodiments, the copper-containing layer 140 can have an average lateral dimension range from about 10 nm to about 10 mm. In some embodiments, the silver-containing layer 120 has an average lateral dimension range from about 10 nm to about 10 mm, about 100 nm to about 10 mm, about 1 μm to about 10 mm, about 10 μm to about 10 mm, about 100 μm to about 10 mm, about 1 mm to about 10 mm, about 10 nm to about 1 mm, about 100 nm to about 1 mm, about 1 μm to about 1 mm, about 10 μm to about 1 mm, about 100 μm to about 1 mm, about 1 mm to about 1 mm, about 10 nm to about 100 μm, about 100 nm to 100 μm, about 1 μm to about 100 μm, about 10 μm to about 100 μm, inclusive of any average lateral dimension ranges therebetween.

In some embodiments, the average lateral dimension of the copper-containing layer 140 and the average lateral dimension of the silver-containing layer 120 are the same or essentially the same. In some embodiments, the average lateral dimension of the copper-containing layer 140 is slightly less than the average lateral dimension of the silver-containing layer 120. In other embodiments, the average lateral dimension of the copper-containing layer 140 is about 95%, about 90%, about 85%, about 80%, about 75%, about 70%, about 65%, about 60%, about 55%, about 50%, about 45%, about 40%, about 35%, about 30%, about 25%, about 20%, about 15%, about 10%, or about 5% of the average lateral dimension of the silver-containing layer 120.

In some embodiments, the average lateral dimension of the copper-containing layer 140 is slightly larger than the average lateral dimension of the silver-containing layer 120. In other embodiments, the average lateral dimension of the copper-containing layer 140 is about 102%, about 104%, about 106%, about 108%, about 110%, about 112%, about 114%, about 116%, about 118%, about 120%, about 125%, about 130%, about 135%, about 140%, about 145%, about 150%, about 160%, about 170%, about 180%, about 190%, or about 200% of the average lateral dimension of the silver-containing layer 120.

Once the copper-containing layer 140 is deposited onto a portion of the silver-containing layer 120, the method 200 further includes sintering the copper-containing layer at or below a temperature of 300° C. via at least one of: thermalsintering, photosintering, lasersintering, or local resistive heating. In some embodiments, the sintering the copper-containing layer occurs at or below a temperature of 300° C. In some embodiments, the sintering the copper-containing layer occurs at or below a temperature of 290° C., at or below a temperature of 280° C., at or below a temperature of 270° C., at or below a temperature of 260° C., at or below a temperature of 250° C., at or below a temperature of 245° C., at or below a temperature of 240° C., at or below a temperature of 235° C., at or below a temperature of 230° C., at or below a temperature of 225° C., at or below a temperature of 220° C., at or below a temperature of 215° C., at or below a temperature of 210° C., at or below a temperature of 205° C., at or below a temperature of 200° C., at or below a temperature of 195° C., at or below a temperature of 190° C., at or below a temperature of 185° C., at or below a temperature of 180° C., at or below a temperature of 175° C., at or below a temperature of 170° C., at or below a temperature of 165° C., at or below a temperature of 160° C., at or below a temperature of 155° C., at or below a temperature of 150° C., at or below a temperature of 145° C. at or below a temperature of 140° C., at or below a temperature of 135° C. at or below a temperature of 130° C., at or below a temperature of 125° C., at or below a temperature of 120° C., at or below a temperature of 115° C., at or below a temperature of 110° C., at or below a temperature of 105° C., at or below a temperature of 100° C., at or below a temperature of 95° C., at or below a temperature of 90° C., at or below a temperature of 85° C., at or below a temperature of 80° C., inclusive of any temperature therebetween.

The electronic assembly material 160 can be a solder material or a solder less material. In some embodiments, the electronic assembly material 160 can be any existing solder material, including commercially available solder materials. The electronic assembly material 160 that are the solder material can include tin, silver, bismuth, indium, zinc, gold, antimony, lead, gallium, etc. In some embodiments, the electronic assembly material 160 can be a solder less material, such as a nanocopper assembly.

In some embodiments, the electronic assembly material 160 can have an average lateral dimension range from about 10 nm to about 10 mm. In some embodiments, the electronic assembly material 160 has an average lateral dimension range from about 10 nm to about 10 mm, about 100 nm to about 10 mm, about 1 μm to about 10 mm, about 10 μm to about 10 mm, about 100 μm to about 10 mm, about 1 mm to about 10 mm, about 10 nm to about 1 mm, about 100 nm to about 1 mm, about 1 μm to about 1 mm, about 10 μm to about 1 mm, about 100 μm to about 1 mm, about 1 mm to about 1 mm, about 10 nm to about 100 μm, about 100 nm to 100 μm, about 1 μm to about 100 μm, about 10 μm to about 100 μm, inclusive of any average lateral dimension ranges therebetween.

In some embodiments, the average lateral dimension of the electronic assembly material 160 and the average lateral dimension of the copper-containing layer 140 are the same or essentially the same. In some embodiments, the average lateral dimension of the electronic assembly material 160 is slightly less than the average lateral dimension of the copper-containing layer 140. In other embodiments, the average lateral dimension of the electronic assembly material 160 is about 95%, about 90%, about 85%, about 80%, about 75%, about 70%, about 65%, about 60%, about 55%, about 50%, about 45%, about 40%, about 35%, about 30%, about 25%, about 20%, about 15%, about 10%, or about 5% of the average lateral dimension of the copper-containing layer 140.

In some embodiments, the average lateral dimension of the electronic assembly material 160, the average lateral dimension of the copper-containing layer 140, and the average lateral dimension of the silver-containing layer 120 are the same or essentially the same. In some embodiments, the average lateral dimension of the electronic assembly material 160 is the same or substantially the same as the average lateral dimension of the copper-containing layer 140, which is slightly less than the average lateral dimension of the silver-containing layer 120. In other embodiments, the average lateral dimension of the electronic assembly material 160 and the average lateral dimension of the copper-containing layer 140 are about 95%, about 90%, about 85%, about 80%, about 75%, about 70%, about 65%, about 60%, about 55%, about 50%, about 45%, about 40%, about 35%, about 30%, about 25%, about 20%, about 15%, about 10%, or about 5% of the average lateral dimension of the copper-containing layer 140.

In some embodiments, the average lateral dimension of the electronic assembly material 160 is slightly less than the average lateral dimension of the copper-containing layer 140, which is slightly less than the average lateral dimension of the silver-containing layer 120. In some of these embodiments, the average lateral dimension of the electronic assembly material 160 is about 95%, about 90%, about 85%, about 80%, about 75%, about 70%, about 65%, about 60%, about 55%, about 50%, about 45%, about 40%, about 35%, about 30%, about 25%, about 20%, about 15%, about 10%, or about 5% of the average lateral dimension of the copper-containing layer 140, and the average lateral dimension of the copper-containing layer 140 is about 95%, about 90%, about 85%, about 80%, about 75%, about 70%, about 65%, about 60%, about 55%, about 50%, about 45%, about 40%, about 35%, about 30%, about 25%, about 20%, about 15%, about 10%, or about 5% of the average lateral dimension of the silver-containing layer 120.

In some embodiments, the copper-silver interface 130, which is formed between the copper-containing layer 140 and the silver-containing layer 120, includes a layer of atomically mixed copper-silver solid solution. In some embodiments, the copper-silver interface 130 includes a sharp boundary between the copper-containing layer 140 and the silver-containing layer 120. In other embodiments, the solder-copper interface 150, which is formed between the electronic assembly material 160 and the copper-containing layer 140, includes a layer of atomically mixed copper and electronic assembly material, including but not limited to, tin, silver, bismuth, indium, zinc, gold, antimony, lead, gallium, etc. In some embodiments, the solder-copper interface 150 includes multiple phases of electronic assembly material and copper.

Figure 2:
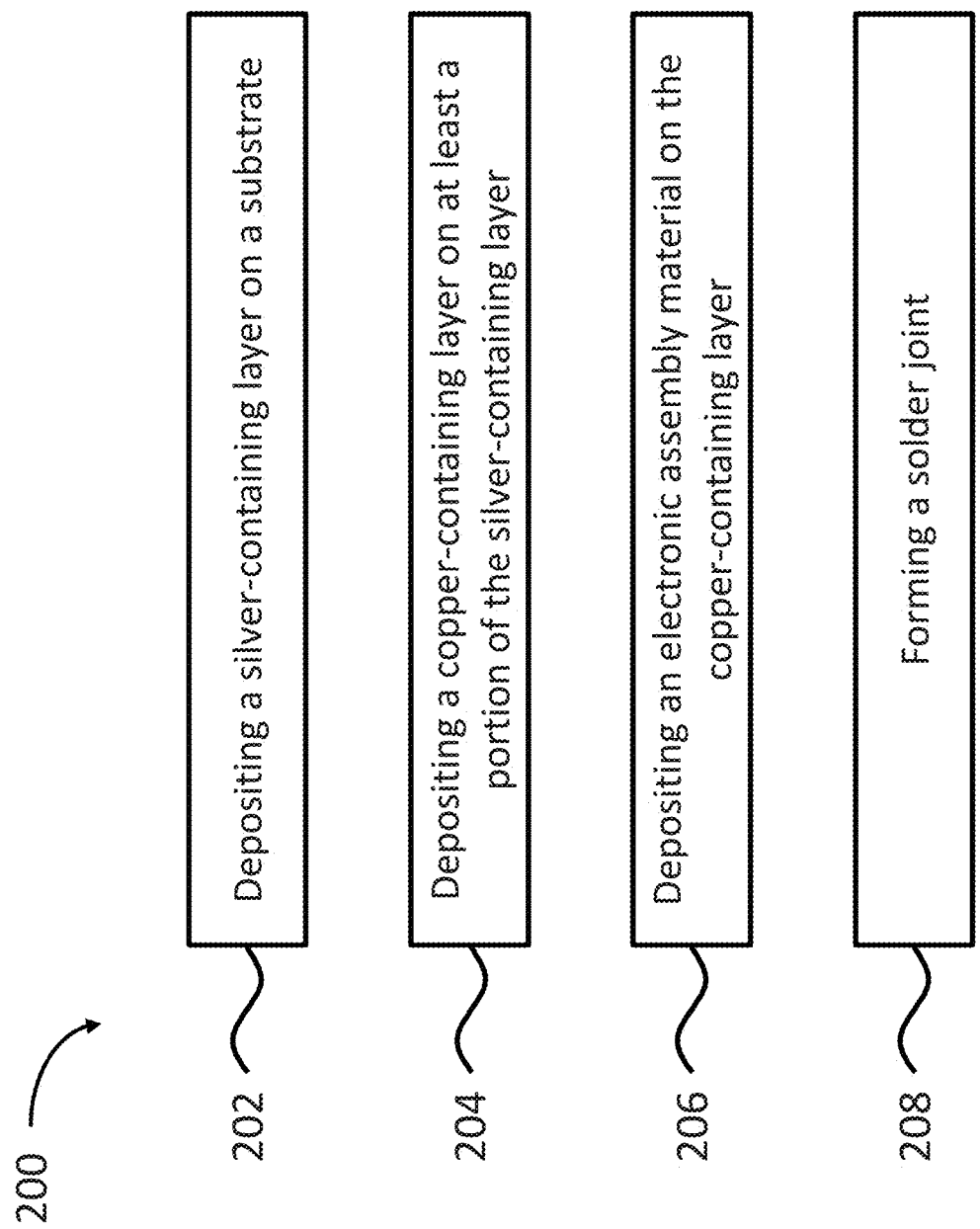
FIG. 2 shows process steps of a method of soldering using a copper-containing layer, according to some embodiments.

FIG. 2 shows process steps of a method 200 of soldering, according to some embodiments. As shown in the process flow in FIG. 2, the soldering method 200 includes: at step 202, depositing a silver-containing layer on a substrate; at step 204, depositing a copper-containing layer on at least a portion of the silver-containing layer; at step 206, depositing an electronic assembly material on at least a portion of the copper-containing layer; and at step 208 forming a solder joint.

At step 202, the method 200 describes depositing of a silver-containing layer on a substrate. The disposition of the silver-containing layer onto the substrate can be performed via a number of deposition techniques including, but not limited to, printing, aerosoljet printing, inkjet printing, Gravure printing, offset printing, screen printing, stencil printing, any roll-to-roll printing technique, physical vapor deposition, chemical vapor deposition, atomic layer deposition, spray coating, plasma spray coating, electroplating, electroless plating, etc. In some embodiments, a mask (e.g., a photomask, a lithography mask, etc.) can be used to form the shape of the silver-containing layer being deposited on the substrate. The technique of using a mask during deposition is referred to herein as "additive technique". In some embodiments, a layer of silver is first deposited (without a mask), and the shape of the silver-containing layer is then etched (referred to herein as "subtractive technique") to form the desired shape of the silver-containing layer. The etching can be performed using a number of known etching techniques, including chemical etching, plasma etching, ion etching, etc.

Once the silver-containing layer is deposited on the substrate, the disposition of the copper-containing layer on at least a portion of the silver-containing layer can commence at step 204. Similar to the step 202, the disposition of the copper-containing layer onto the substrate can also be performed via a number of deposition techniques including, but not limited to, printing, aerosoljet printing, inkjet printing, Gravure printing, offset printing, screen printing, stencil printing, any roll-to-roll printing technique, physical vapor deposition, chemical vapor deposition, atomic layer deposition, spray coating, plasma spray coating, electroplating, electroless plating, etc. In some embodiments, a mask can be used to form the shape of the copper-containing layer being deposited on top of the previously formed silver-containing layer. In some embodiments, a layer of copper is first deposited, and the shape of the copper-containing layer is then etched to form the desired shape of the copper-containing layer.

In some embodiments, both the silver-containing layer and the copper-containing layer are first blanket deposited onto the substrate and a single mask is used to etch the two layers to form the desired shape of the silver and copper-containing layers. In these embodiments, the resulting layers of silver and copper form the same shape, in which the copper-containing layer is deposited on an entire surface of the silver-containing layer.

In some embodiments, both the silver-containing layer and the copper-containing layer are deposited sequentially onto the substrate using the same mask to form the desired shape of the silver and copper-containing layers. The resulting layers of silver and copper also form the same shape, in which the copper-containing layer is deposited on an entire surface of the silver-containing layer. In some embodiments where a copper-containing layer is deposited on a portion of the silver-containing layer, a second mask is used to form the copper-containing layer on a portion of the silver-containing layer. In some embodiments, any combination of additive and subtractive techniques maybe used to from the desired shapes of copper and silver-containing layers.

In some embodiments, both the silver-containing layer and the copper-containing layer are printed via a printer, an aerosoljet printer, an inkjet printer to print silver containing or copper containing inks.

In some embodiments, the silver ink includes silver particles having an average particle size range from about 1 nm to about 100 μm. In some embodiments, the silver particles have an average particle size range from about 1 nm to about 100 μm, about 10 nm to about 100 μm, about 100 nm to about 100 μm, about 1 μm to about 100 μm, about 10 μm to about 100 μm, from about 10 nm to about 10 μm, about 100 nm to about 10 μm, about 1 μm to about 10 μm, about 100 nm to about 1 μm, about 1 nm to about 100 nm, about 2 nm to about 50 nm, inclusive of any average lateral dimension ranges therebetween.

In some embodiments, the copper ink includes copper particles having an average particle size range from about 1 nm to about 100 μm. In some embodiments, the copper particles have an average particle size range from about 1 nm to about 100 μm, about 10 nm to about 100 μm, about 100 nm to about 100 μm, about 1 μm to about 100 μm, about 10 μm to about 100 μm, from about 10 nm to about 10 μm, about 100 nm to about 10 μm, about 1 μm to about 10 μm, about 100 nm to about 1 μm, about 1 nm to about 100 nm, about 2 nm to about 50 nm, inclusive of any average lateral dimension ranges therebetween.

At step 206, the method 200 describes depositing an electronic assembly material on at least a portion of the copper-containing layer. The deposition of the electronic assembly material can be performed via any existing or commercially available techniques.

Once the electronic assembly material is deposited onto a portion of the copper-containing layer, the method 200 describes forming a solder joint at step 208. In some embodiments, the solder joint is formed at or below a temperature of 300° C. In some embodiments, the solder joint is formed at or below a temperature of 290° C., at or below a temperature of 280° C. at or below a temperature of 270° C., at or below a temperature of 260° C., at or below a temperature of 250° C., at or below a temperature of 245° C., at or below a temperature of 240° C., at or below a temperature of 235° C., at or below a temperature of 230° C., at or below a temperature of 225° C., at or below a temperature of 220° C., at or below a temperature of 215° C., at or below a temperature of 210° C., at or below a temperature of 205° C., at or below a temperature of 200° C., at or below a temperature of 195° C., at or below a temperature of 190° C., at or below a temperature of 185° C., at or below a temperature of 180° C., at or below a temperature of 175° C. at or below a temperature of 170° C., at or below a temperature of 165° C., at or below a temperature of 160° C., at or below a temperature of 155° C., at or below a temperature of 150° C. at or below a temperature of 145° C. at or below a temperature of 140° C., at or below a temperature of 135° C. at or below a temperature of 130° C., at or below a temperature of 125° C., at or below a temperature of 120° C., at or below a temperature of 115° C., at or below a temperature of 110° C., at or below a temperature of 105° C., at or below a temperature of 100° C., at or below a temperature of 95° C., at or below a temperature of 90° C., at or below a temperature of 85° C., at or below a temperature of 80° C., inclusive of any temperature therebetween.

In some embodiments, at least one of a solder-copper interface, or a copper-silver interface forms at or below a temperature of 300° C. In some embodiments, at least one of the solder-copper interface, or the copper-silver interface forms at or below a temperature of 290° C., at or below a temperature of 280° C., at or below a temperature of 270° C., at or below a temperature of 260° C., at or below a temperature of 250° C., at or below a temperature of 245° C., at or below a temperature of 240° C., at or below a temperature of 235° C., at or below a temperature of 230° C., at or below a temperature of 225° C., at or below a temperature of 220° C., at or below a temperature of 215° C., at or below a temperature of 210° C., at or below a temperature of 205° C., at or below a temperature of 200° C., at or below a temperature of 195° C., at or below a temperature of 190° C., at or below a temperature of 185° C., at or below a temperature of 180° C., at or below a temperature of 175° C., at or below a temperature of 170° C., at or below a temperature of 165° C., at or below a temperature of 160° C., at or below a temperature of 155° C., at or below a temperature of 150° C., at or below a temperature of 145° C. at or below a temperature of 140° C., at or below a temperature of 135° C. at or below a temperature of 130° C., at or below a temperature of 125° C., at or below a temperature of 120° C., at or below a temperature of 115° C., at or below a temperature of 110° C., at or below a temperature of 105° C., at or below a temperature of 100° C., at or below a temperature of 95° C., at or below a temperature of 90° C., at or below a temperature of 85° C., at or below a temperature of 80° C., inclusive of any temperature therebetween.

In some embodiments, the temperature can be dictated by the electronic assembly material being used. For example, in some embodiments, the temperature can be about 280° C. for an electronic assembly material, such as gold tin (AuSn). In other embodiments, the temperature can be lower than 280° C. for an electronic assembly material that contains indium or gallium.

In some embodiments, the silver interface could potentially be formed at a lower temperature. When a photosintering technique is used, the silver or copper-containing layer can reach a very high temperature upon illumination while the other part of the substrate may remain at an ambient or room temperature. Therefore, in some embodiments, the substrate stays relatively cool and the technique itself is considered a low-temperature or room-temperature soldering.

Similarly, when a local resistive heating technique is used, the silver or copper-containing layer can reach a very high temperature upon applying a current locally to either or both of the silver or copper-containing layer while the other part of the substrate may remain at an ambient or room temperature. Therefore, the substrate stays relatively cool and the technique itself is considered a low-temperature or room-temperature soldering.

In some embodiments, the solder joint is formed via at least one of sintering, photosintering, lasersintering, local resistive heating, or electrochemical deposition. Since the electronic assembly material wets the copper much more readily than silver does, the electronic assembly material tends to flow where the copper-containing layer is. The differential wetting of the electronic assembly material to copper and silver provides a control over the extent of solder flow to the portion of the copper-containing layer when forming the solder joint at a prescribed temperature. For example, the use of copper can provide a capability in soldering during production of RF circuits where center-fed antennas generally have very small leads for soldering which requires a tight control over the extent of solder flow.

In some embodiments, the silver-containing layer and the copper-containing layer are deposited on the substrate, and then sintered at the same time, or substantially the same time, prior to depositing of the electronic assembly material. After the electronic assembly material is deposited, then the entire stack is sintered to form a solder joint.

In some embodiments, the silver-containing layer is deposited and sintered prior to the deposition of the copper-containing layer. Once the copper-containing layer is deposited, it is sintered. In essence, the silver-containing layer and the copper-containing layer are sequentially deposited and sintered, prior to depositing of the electronic assembly material. After the electronic assembly material is deposited, then the entire stack is sintered to form a solder joint.

In some embodiments, each of the silver-containing layer, the copper-containing layer, and the electronic assembly material are deposited on the substrate, and then sintered at the same time.

FIGS. 3A-3E show optical images of the solder joint 300 after each process step of the method 200 shown in FIG. 2. As show in FIGS. 3A-3E, the solder joint 300 is achieved when each of the process steps is performed as described. FIG. 3A shows an empty substrate 310 prior to any disposition. After process step 302, which is substantially similar to step 202, a silver-containing layer 320 is shown to have been deposited on at least a portion of the substrate 310, as shown in FIG. 3B. After process step 304, which is substantially similar to step 204, a copper-containing layer 340 is shown to have been deposited on at least a portion of the silver-containing layer 320, as shown in FIG. 3C. In FIG. 3C, the silver-containing layer 320 is deposited on four areas of the substrate 310.

After process step 306, which is substantially similar to step 206, an electronic assembly material 360 is shown to have been deposited on at least a portion of the copper-containing layer 340, as shown in FIG. 3D. In FIG. 3D, only two of the four areas of the copper-containing layer 340 has the electronic assembly material 360 deposited. FIG. 3E shows an example circuit board onto which two solder joints 300 are formed when two wires are soldered onto the copper-containing layer 340.

Figure 4:
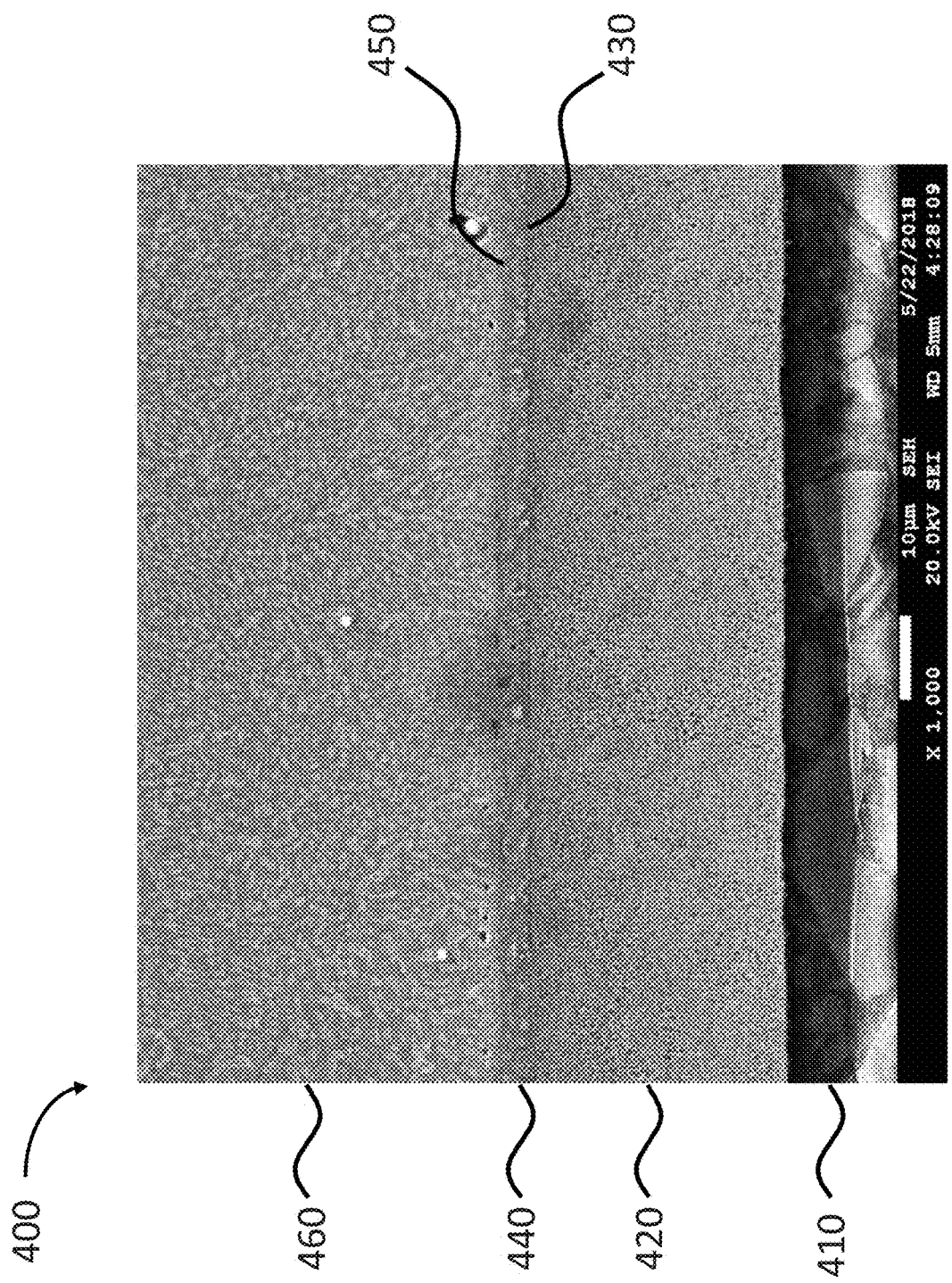
FIG. 4 shows a cross-sectional scanning electron microscopy (SEM) image of a solder joint.

FIG. 4 shows a cross-sectional scanning electron microscopy (SEM) image of a solder joint 400. The SEM image of FIG. 4 shows the solder joint 400 on a substrate 410. The solder joint 400 includes an electronic assembly material 460 deposited on a copper-containing layer 440, which is deposited on a silver-containing layer 420, which is deposited on the substrate 410. The SEM image of FIG. 4 also shows that the solder joint 400 further includes a copper-silver interface 430 between the copper-containing layer 440 and the silver-containing layer 420, and a solder-copper interface 450 between the electronic assembly material 460 and the copper-containing layer 440.

To form a solder joint as shown in FIG. 4, a method of soldering is described herein. The method includes depositing a silver-containing layer on a portion of a substrate, depositing a copper-containing layer on at least a portion of the silver-containing layer, depositing an electronic assembly material on at least a portion of the copper-containing layer, and forming a solder joint. In the method, the depositing the copper-containing layer occurs via at least one of: a printing technique, or electrochemical deposition. After the depositing the copper-containing layer occurs via the printing technique, the method further includes sintering the copper-containing layer at or below a temperature of 300° C. via at least one of: thermalsintering, photosintering, lasersintering, or local resistive heating.

In some embodiments, the forming of the solder joint occurs via at least one of a hot iron, oven reflow, or wave soldering. In other embodiments of the method, the solder joint comprises a solder-copper interface and a copper-silver interface. In some embodiments, the substrate is at least one of: a printed circuit board, a flexible substrate, a foldable substrate, a stretchable substrate, a stretchable substrate, a semi-rigid circuit board, or a rigid circuit board. In other embodiments, the substrate is at least one of a glass-filled teflon, a polyimide, or a PTFE.

In some embodiments, the copper-containing layer has a thickness of about 1 nm to about 100 μm. In some embodiments, the copper-containing layer is deposited via an aerosoljet. In other embodiments, the copper-containing layer is deposited on an entire surface of the silver-containing layer. In some embodiments, the electronic assembly material is deposited on an entire surface of the copper-containing layer.

As described herein, an article comprising a solder joint deposited on a portion of a substrate, wherein the solder joint comprises a silver-containing layer, a copper-containing layer, and an electronic assembly material is provided. In the article, the copper-containing layer is formed at or below a temperature of 300° C. In some embodiments, the copper-containing layer is formed via at least one of: sintering, thermalsintering, photosintering, lasersintering, local resistive heating, or electrochemical deposition. In the article, the solder joint further includes at least one of: a solder-copper interface between the electronic assembly material and the copper-containing layer, or a copper-silver interface between the copper-containing layer and the silver-containing layer. In some embodiments, the substrate is at least one of: a printed circuit board, a flexible substrate, a foldable substrate, a stretchable substrate, a semi-rigid circuit board, or a rigid circuit board. In some embodiments, the copper-containing layer in the article has a thickness of about 1 nm to about 10 μm.

As described herein, a method of soldering includes depositing a silver-containing layer on a portion of a substrate, depositing a copper-containing layer on at least a portion of the silver-containing layer, depositing an electronic assembly material on at least a portion of the copper-containing layer, and forming a solder joint having a solder-copper interface between the electronic assembly material and the at least a portion of the copper-containing layer, and a copper-silver interface between the copper-containing layer and the at least a portion of the silver-containing layer. In some embodiments, at least one of: the solder-copper interface, or the copper-silver interface forms below a temperature of 300° C. In other embodiments, the copper-containing layer has a thickness of about 1 nm to about 10 μm.

Although the disclosure has been described with reference to the above embodiments, one of ordinary skill in the art will readily appreciate that these are only illustrative of the disclosure. It should be understood that various modifications can be made without departing from the spirit of the disclosure. The disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description.

The invention claimed is:

1. A method of soldering comprising:
depositing a silver-containing layer on a portion of a substrate;
depositing a copper-containing layer on at least a portion of the silver-containing layer wherein the depositing the copper-containing layer occurs via at least one of: a printing technique, or electrochemical deposition;
depositing an electronic assembly material on at least a portion of the copper-containing layer; and
forming a solder joint.

2. The method of claim 1, wherein the depositing the copper-containing layer occurs via the printing technique, the method further comprising:
sintering the copper-containing layer at or below a temperature of 300° C. via at least one of: thermalsintering, photosintering, lasersintering, or local resistive heating.

3. The method of claim 1, wherein the forming of the solder joint occurs via at least one of a hot iron, oven reflow, or wave soldering.

4. The method of claim 1, wherein the electronic assembly material is a solder material or a solder-less material.

5. The method of claim 1, wherein the substrate is at least one of: a printed circuit board, a flexible substrate, a foldable substrate, a stretchable substrate, a semi-rigid circuit board, or a rigid circuit board.

6. The method of claim 1, wherein the substrate is at least one of: glass fiber epoxy resin, polyimide (Kapton), polyethylene terephthalate (PET), acrylonitrile butadiene styrene (ABS), glass-filled teflon (PTFE), or other composite fiber substrates, polyvinylidene fluoride (PVDF).

7. The method of claim 1, wherein the copper-containing layer has a thickness of about 1 nm to about 100 μm.

8. The method of claim 1, wherein the copper-containing layer is deposited via an aerosoljet.

9. The method of claim 1, wherein the copper-containing layer is deposited on an entire surface of the silver-containing layer.

10. The method of claim 1, wherein the electronic assembly material is deposited on an entire surface of the copper-containing layer.

11. A method of soldering comprising:
depositing a silver-containing layer on a portion of a substrate;
depositing a copper-containing layer on at least a portion of the silver-containing layer wherein the depositing the copper-containing layer occurs via at least one of: a printing technique, or electrochemical deposition;
depositing an electronic assembly material on at least a portion of the copper-containing layer; and
forming a solder joint having a solder-copper interface between the electronic assembly material and the at least a portion of the copper-containing layer, and a copper-silver interface between the copper-containing layer and the at least a portion of the silver-containing layer.

12. The method of claim 11, wherein at least one of: the solder-copper interface, or the copper-silver interface forms below a temperature of 300° C.

13. The method of claim 11, wherein the copper-containing layer has a thickness of about 1 nm to about 100 μm.

14. A method of soldering comprising:
depositing a silver-containing layer on a portion of a substrate;
depositing a copper-containing layer on at least a portion of the silver-containing layer;
depositing an electronic assembly material on at least a portion of the copper-containing layer; and
forming a solder joint, wherein the forming of the solder joint occurs via at least one of a hot iron, oven reflow, or wave soldering.

15. A method of soldering comprising:
depositing a silver-containing layer on a portion of a substrate, wherein the substrate is at least one of: glass fiber epoxy resin, polyimide (Kapton), polyethylene terephthalate (PET), acrylonitrile butadiene styrene (ABS), glass-filled teflon (PTFE), or other composite fiber substrates, polyvinylidene fluoride (PVDF);
depositing a copper-containing layer on at least a portion of the silver-containing layer;
depositing an electronic assembly material on at least a portion of the copper-containing layer; and
forming a solder joint.

* * * * *